(12) United States Patent  
Arimitsu

(10) Patent No.: US 8,269,236 B2  
(45) Date of Patent: Sep. 18, 2012

(54) LIGHT-EMITTING DIODE AND FABRICATION METHOD THEREOF

(75) Inventor: Masao Arimitsu, Chichibu (JP)

(73) Assignee: Showa Denko K.K., Tokyo (JP)

( * ) Notice: Subject to any disclaimer, the term of this patent is extended or adjusted under 35 U.S.C. 154(b) by 876 days.

(21) Appl. No.: 12/278,646

(22) PCT Filed: Feb. 6, 2007

(86) PCT No.: PCT/JP2007/052448  
§ 371 (c)(1),  
(2), (4) Date: Sep. 17, 2008

(87) PCT Pub. No.: WO2007/091704  
PCT Pub. Date: Aug. 16, 2007

(65) Prior Publication Data  
US 2009/0008661 A1 Jan. 8, 2009

Related U.S. Application Data

(60) Provisional application No. 60/773,677, filed on Feb. 16, 2006, provisional application No. 60/773,678, filed on Feb. 16, 2006.

(30) Foreign Application Priority Data

Feb. 8, 2006 (JP) .................................. 2006-030475  
Feb. 9, 2006 (JP) .................................. 2006-032028

(51) Int. Cl.  
*H01L 33/00* (2010.01)  
*H01L 21/00* (2006.01)

(52) U.S. Cl. ..................... 257/96; 257/E33.032; 438/46; 438/29

(58) Field of Classification Search .................. None  
See application file for complete search history.

(56) References Cited

U.S. PATENT DOCUMENTS  
6,229,160 B1  5/2001  Krames et al.  
(Continued)

FOREIGN PATENT DOCUMENTS  
CN  1552103 A  12/2004  
(Continued)

OTHER PUBLICATIONS

Y. Hosokawa, et al. "High-power ohmic-electrodes dispersive AlGaInP double-hetero structure yellowish-green light-emitting diodes," Journal of Crystal Growth 221, 2000, pp. 652-656.

*Primary Examiner* — Ha Tran T Nguyen  
*Assistant Examiner* — Valerie N Brown  
(74) *Attorney, Agent, or Firm* — Sughrue Mion, PLLC

(57) ABSTRACT

A light-emitting diode (10) has a light-extracting surface and includes a transparent substrate (14), a compound semiconductor layer (13) bonded to the transparent substrate, a light-emitting part (12) contained in the compound semiconductor layer, a light-emitting layer (133) contained in the light-emitting part and formed of $(Al_XGa_{1-X})_YIn_{1-Y}P(0 \leq X \leq 1, 0 < Y \leq 1)$, first and second electrodes (15, 16) of different polarities provided on a surface of the light-emitting diode opposite the light-extracting surface, and a reflecting metal film (17) formed on the first electrode. The transparent substrate has a first side face (142) virtually perpendicular to a light-emitting surface of the light-emitting layer on a side near the light-emitting layer and a second side face (143) oblique to the light-emitting surface on a side distant from the light-emitting layer. The first and second electrodes are mounted respectively on electrode terminals (43, 44).

22 Claims, 6 Drawing Sheets

U.S. PATENT DOCUMENTS

| | | | |
|---|---|---|---|
| 2002/0050601 A1 | 5/2002 | Saeki et al. | |
| 2003/0201449 A1 | 10/2003 | Saeki et al. | |
| 2004/0070000 A1 | 4/2004 | Ng et al. | |
| 2005/0023543 A1 | 2/2005 | Konno | |
| 2005/0156185 A1 | 7/2005 | Kim et al. | |
| 2005/0221527 A1 * | 10/2005 | Yeh et al. | 438/46 |
| 2005/0255615 A1 | 11/2005 | Sugawara et al. | |
| 2006/0124945 A1 | 6/2006 | Baur et al. | |

FOREIGN PATENT DOCUMENTS

| | | |
|---|---|---|
| JP | 5834985 | 3/1983 |
| JP | 3230638 B2 | 9/1994 |
| JP | 6302857 A | 10/1994 |
| JP | 2588849 B2 | 12/1996 |
| JP | 10-173234 A | 6/1998 |
| JP | 200157441 A | 2/2001 |
| JP | 2002-203987 A | 7/2002 |
| JP | 2002246640 A | 8/2002 |
| JP | 2003-249682 A | 9/2003 |
| JP | 2003-298108 A | 10/2003 |
| JP | 2004-134803 A | 4/2004 |
| JP | 2005-019695 A | 1/2005 |
| JP | 2005-072340 A | 3/2005 |
| JP | 2005-072628 A | 3/2005 |
| JP | 2005-210051 A | 8/2005 |
| JP | 2006-501656 A | 1/2006 |
| WO | 02061847 A2 | 8/2002 |
| WO | 2004/032248 A2 | 4/2004 |

* cited by examiner

US 8,269,236 B2

LIGHT-EMITTING DIODE AND FABRICATION METHOD THEREOF

CROSS REFERENCE TO RELATED APPLICATIONS

This application is an application filed under 35 U.S.C. §111(a) claiming the benefit pursuant to 35 U.S.C. §119(e)(1) of the filing dates of Provisional Applications No. 60/773,677 filed Feb. 16, 2006 and No. 60/773,678 filed Feb. 16, 2006 and Japanese Patent Applications No. 2006-030475 filed Feb. 8, 2006 and No. 2006-032028 filed Feb. 9, 2006 pursuant to 35 U.S.C. §111(b).

TECHNICAL FIELD

This invention relates to a light-emitting diode having semiconductor layers which include a light-emitting layer formed of aluminum-gallium-indium phosphide (($Al_X Ga_{1-X}$)$_Y In_{1-Y}$P in which $0 \leq X \leq 1$ and $0 < Y \leq 1$) and which are joined to a transparent substrate and to a fabrication method thereof.

BACKGROUND ART

As a Light-Emitting Diode (LED) capable of issuing a visible light in red color, orange color, yellow color or yellowish green color, the compound semiconductor LED that is provided with a light-emitting layer formed of aluminum-gallium-indium phosphide (($Al_X Ga_{1-X}$)$_Y In_{1-Y}$P in which $0 \leq X \leq 1$ and $0 < Y \leq 1$) has been hitherto known. In the LED of this kind, the light-emitting part provided with a light-emitting layer formed of ($Al_X Ga_{1-X}$)$_Y In_{1-Y}$P in which $0 \leq X \leq 1$ and $0 < Y \leq 1$ is generally formed on a substrate material, such as gallium arsenide (GaAs), which is optically impervious to the light emitted from the light-emitting layer and mechanically not too strong.

Recently, therefore, with a view to obtaining a visible LED of higher brightness and with the object of further enhancing the mechanical strength of the device, the technique for configuring a junction-type LED by expelling an impervious substrate material, such as GaAs, and thereafter incorporating anew a supporting layer capable of transmitting the emitted light and as well excellent in mechanical strength more than ever has been being developed (refer, for example, to Japanese Patent No. 3230638, JP-A HEI 6-302857, JP-A 2002-246640, Japanese Patent 2588849 and JP-A 2001-57441).

For the purpose of obtaining a visible LED of high brightness, the method for enhancing the efficiency of light extraction by utilizing the shape of a device has been being used. In the configuration of a device having electrodes formed respectively on the first surface and the back surface of a semiconductor light-emitting diode, the technique for effecting impartation of high brightness by utilizing the shapes of side faces has been disclosed (refer, for example, to JP-A SHO 58-34985 and U.S. Pat. No. 6,229,160).

Though the junction-type LED has made it possible to provide an LED of high brightness, the need to seek an LED of yet higher brightness is still persisting. Numerous shapes have been proposed for the devices that are so configured as to have electrodes formed respectively on the first surface and the back surface of a light-emitting diode. The device of a configuration having two electrodes formed on a surface opposite a light-extracting surface is complicated in shape and has not been optimized as respects the state of side faces and the disposition of electrodes.

This invention is directed toward the light-emitting diode provided on the surface thereof opposite the light-extracting surface with two electrodes and is aimed at providing a light-emitting diode of high brightness that exhibits a high efficiency in the extraction of light.

DISCLOSURE OF THE INVENTION

The present invention provides as the first aspect thereof a light-emitting diode having a light-extracting surface and comprising a transparent substrate, a compound semiconductor layer bonded to the transparent substrate, a light-emitting part contained in the compound semiconductor layer, a light-emitting layer contained in the light-emitting part and formed of ($Al_X Ga_{1-X}$)$_Y In_{1-Y}$P ($0 \leq X \leq 1$, $0 < Y \leq 1$), a first electrode and a second electrode of different polarities provided on a surface of the light-emitting diode opposite the light-extracting surface, and a reflecting metal film formed on the first electrode, wherein the transparent substrate has a first side face virtually perpendicular to a light-emitting surface of the light-emitting layer on a side near the light-emitting layer and a second side face oblique to the light-emitting surface on a side distant from the light-emitting layer and wherein the first and second electrodes are mounted respectively on electrode terminals.

The second aspect of the present invention provides the light-emitting diode according to the first aspect, wherein the second electrode is formed at a position of a corner of the compound semiconductor layer on a side opposed to the first electrode.

The third aspect of the invention provides the light-emitting diode according to the second aspect, wherein the second electrode is positioned below an oblique structure of the second side face.

The fourth aspect of the invention includes the light-emitting diode according to the first or second aspect, wherein the transparent substrate is made of an n-type GaP.

The fifth aspect of the invention includes the light-emitting diode according to the first or second aspect, wherein the transparent substrate has a (100) or (111) surface orientation.

The sixth aspect of the invention includes the light-emitting diode according to the first or second aspect, wherein the transparent substrate has a thickness in a range of 50 to 300 μm.

The seventh aspect of the invention includes the light-emitting diode according to the first or second aspect, wherein the light-emitting part has an outermost layer having a thickness in a range of 0.5 to 20 μm.

The eighth aspect of the invention includes the light-emitting diode according to the first or second aspect, wherein the light-emitting part has an outermost layer made of GaP.

The ninth aspect of the invention includes the light-emitting diode according to the eighth aspect, wherein the outermost layer of the light-emitting part is made of $Ga_X P_{1-X}$ ($0.5 < X < 0.7$).

The tenth aspect of the invention includes the light-emitting diode according to the first or second aspect, wherein the second side face and a surface parallel to the light-emitting surface form an angle in a range of 55° to 80°.

The eleventh aspect of the invention includes the light-emitting diode according to the first or second aspect, wherein the first side face has an width in a range of 30 to 100 μm.

The twelfth aspect of the invention includes the light-emitting diode according to the first aspect, wherein the second electrode has a periphery thereof enclosed with the semiconductor layer.

The thirteenth aspect of the invention includes the light-emitting diode according to the first aspect, wherein the first electrode is in a lattice shape.

The fourteenth aspect of the invention includes the light-emitting diode according to the first or second aspect, wherein the first electrode is a linear electrode having a width of 10 μm or less.

The fifteenth aspect of the invention includes the light-emitting diode according to the first or second aspect, wherein the light-emitting part contains a GaP layer and the second electrode is formed on the GaP layer.

The sixteenth aspect of the invention includes the light-emitting diode according to the first or second aspect, wherein the first electrode has an n type polarity and the second electrode has a p type polarity.

The seventeenth aspect of the invention include the light-emitting diode according to the first or second aspect, wherein the second side face of the transparent substrate has a coarsened surface.

The present invention also provides as the eighteenth aspect thereof a method for the fabrication of a light-emitting diode, comprising the steps of forming a light-emitting part containing a light-emitting layer formed of $(Al_XGa_{1-X})_Y In_{1-Y}P$ ($0 \leq X \leq 1$, $0 < Y \leq 1$), bonding a compound semiconductor layer containing the light-emitting part to a transparent substrate, forming a first electrode and a second electrode different in polarity from the first electrode on a surface of the compound semiconductor layer opposite a light-extracting surface, which surface is on a side opposite the transparent substrate, wherein the second electrode is formed on the compound semiconductor layer exposed on a side opposed to the first electrode, forming a reflecting metal film on a surface of the first electrode, and forming on side faces of the transparent substrate a first side face virtually perpendicular to the light-emitting surface of the light-emitting layer on a side near the light-emitting layer and a second side face oblique to the light-emitting surface on a side distant from the light-emitting layer by the dicing method.

The nineteenth aspect of the invention includes the method for the fabrication of a light-emitting diode according to the eighteenth aspect, wherein the second electrode is formed in a corner on the compound semiconductor layer exposed on a side opposed to the first electrode.

The twentieth aspect of the invention includes the method for the fabrication of a light-emitting diode according to the eighteenth or nineteenth aspect, wherein the first side face is formed by the scribe and break method.

The twenty-first aspect of the invention includes the method for the fabrication of a light-emitting diode according to the eighteenth or nineteenth aspect, wherein the first side face is formed by the dicing method.

The present invention further provides a light-emitting diode having the light-emitting diode according to any one of the first to seventeenth aspects mounted thereon face-down.

This invention allows addition to the efficiency of light extraction from the light-emitting part of the Light-Emitting Diode (LED) and enables provision of an LED with high luminance.

The above and other objects, characteristic features and advantages will become apparent to those skilled in the art from the description to be given herein below with reference to the accompanying drawings.

BEST MODE FOR CARRYING OUT THE INVENTION

Figure 1:
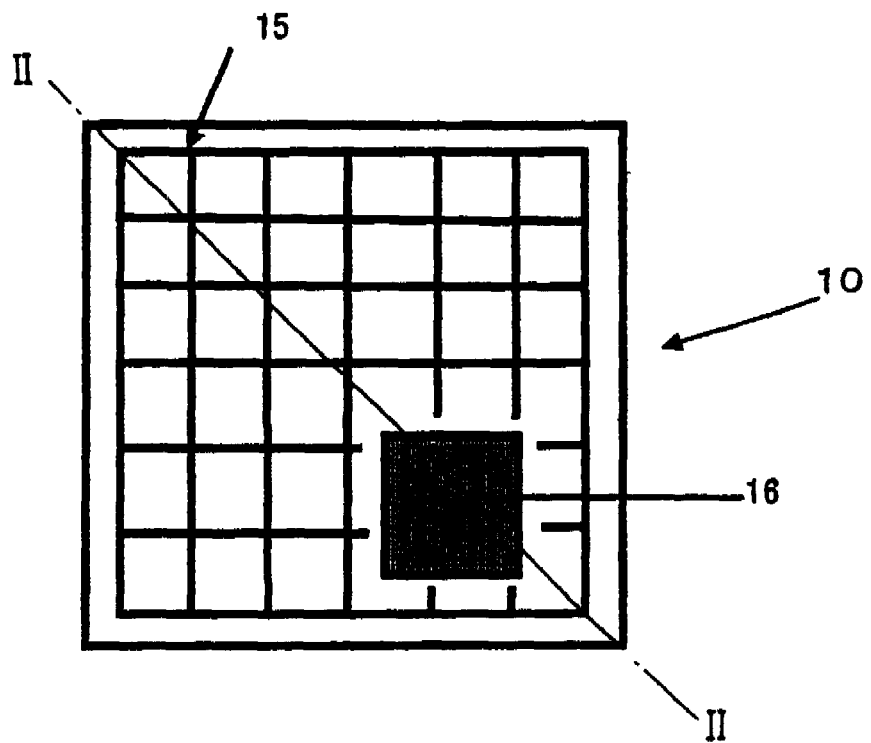
FIG. 1 is a plan view of a semiconductor light-emitting diode involved in the first embodiment of this invention.

The light-emitting part involved in this invention is a stacked structure of a compound semiconductor containing a light-emitting layer made of $(Al_XGa_{1-X})_Y In_{1-Y}P$ ($0 \leq X \leq 1$, $0 < y \leq 1$). The light-emitting layer may be formed of $(Al_XGa_{1-X})_Y In_{1-Y}P$ ($0 \leq X \leq 1$, $0 < y \leq 1$) in either of the conduction types, n and p. Though the light-emitting layer may be in either of the structures, a Single Quantum Well (SQW) and a Multi-Quantum Well (MQW), it prefers to be in the MQW structure for the purpose of obtaining light emission excelling in monochromaticity. A barrier layer forming a Quantum Well (QW) structure and a composition $(Al_XGa_{1-X})_Y In_{1-Y}P$ ($0 \leq X \leq 1$, $0 < y \leq 1$) forming a well layer are so decided that the quantum level inducing an expected wavelength of emitted light may be formed in the well layer.

The light-emitting part, most advantageously for the sake of acquiring light emission of high intensity, is in the so-called Double Hetero (DH) structure that is composed of the light-emitting layer and clad layers disposed respectively at the opposite sides of the light-emitting layer as opposed to each other so as to have confined in the light-emitting part a carrier destined to induce radiation recombination and light emission. The clad layers prefer to be formed of a semiconductor material having a greater width of forbidden band than the composition $(Al_XGa_{1-X})_Y In_{1-Y}P$ ($0 \leq X \leq 1$, $0 < y \leq 1$) forming the light-emitting layer and a high refractive index as well. When the light-emitting layer is formed of $(Al_{0.4}Ga_{0.6})_{0.5}In_{0.5}P$ to emit yellowish green light about 570 nm in wavelength, for example, the clad layers are formed of $(Al_{0.7}Ga_{0.3})_{0.5}In_{0.5}P$. Hosokawa et al., J. Crystal Growth, 221 (2000), 652-656.). Between the light-emitting layer and the clad layers, an intermediate layer aimed at moderately varying the band discontinuity between these layers may be interposed. In this case, the intermediate layer is preferably formed of a semiconductor layer possessing an intermediate width of forbidden band between the light-emitting layer and the clad layers.

The present invention contemplates bonding a transparent substrate (transparent supporting layer) to the semiconductor layer containing the light-emitting layer. The transparent supporting layer is formed of a material possessing strength sufficient for mechanically supporting the light-emitting part, allowing a forbidden band to occupy a great width capable of transmitting the light emitted from the light-emitting part and manifesting optical transparency. For example, Group III-V compound semiconductor crystals, such as gallium phosphide (GaP), aluminum-gallium arsenide (AlGaAs) and gallium nitride (GaN), Group II-VI compound semiconductor crystals, such as zinc sulfide (ZnS) and zinc selenide (ZnSe), and Group IV semiconductor crystals, such as hexagonal or cubic silicon carbide (SiC) are available for the formation of the transparent supporting layer.

The transparent supporting layer prefers to have a thickness of about 50 µm or more in order that it may be enabled to support the light-emitting part with mechanically sufficient strength. Then, the transparent supporting layer prefers to have a thickness not exceeding about 300 µm with a view to facilitating the performance of mechanical processing thereon subsequent to the step of bonding. Optimally, the compound semiconductor LED provided with a light-emitting layer made of $(Al_XGa_{1-X})_YIn_{1-Y}P$ ($0 \leq X \leq 1$, $0 < Y \leq 1$) has the transparent supporting layer formed of an n-type GaP single crystal having a thickness of about 50 µm or more and about 300 µm or less.

When the transparent supporting layer made of gallium phosphide (GaP) is disposed as bonded to the uppermost layer of the light-emitting part, for example, the function of alleviating the stress exerted on the light-emitting part while having the transparent supporting layer bonded thereto can be exhibited by having the uppermost layer of the light-emitting part formed of a Group III-V compound semiconductor material differing in lattice constant from the other Group III-V compound semiconductor component layers of the light-emitting part. It is made possible consequently to prevent the light-emitting layer from sustaining injury during the course of bonding and contribute, for example, to stably providing a compound semiconductor LED that is capable of emitting light having an expected wavelength. The uppermost layer of the light-emitting part to which the transparent supporting layer (transparent substrate) is bonded ideally has a thickness of 0.5 µm or more for the purpose of sufficiently alleviating the stress exerted on the light-emitting part while the transparent supporting layer is being bonded thereto. If the uppermost layer is given an extremely large thickness, the excess of thickness will inevitably result in exerting stress on the light-emitting layer during the disposition of the uppermost layer on account of the difference in lattice constant from the other component layers of the light-emitting part. The uppermost layer is ideally given a thickness of 20 µm or less for the sake of avoiding this mishap.

Particularly, when gallium phosphide (GaP) is selected for the transparent supporting layer convenient for transmitting to the exterior the light emitted from the light-emitting layer made of $(Al_XGa_{1-X})_YIn_{1-Y}P$ ($0 \leq X \leq 1$, $0 < Y \leq 1$), the formation of the uppermost layer of the light-emitting part using a semiconductor material that contains gallium (Ga) and phosphorus (P) as component elements and contains Ga in a larger amount than P allows impartation of strong bond. The uppermost layer is especially suitably formed of a nonstoichiometric composition of $Ga_XP_{1-X}$ ($0.5 < X < 0.7$).

The surface of the transparent supporting layer and the surface of the uppermost layer of the light-emitting part that are fated to be bonded are preferably formed of a single crystal and given an identical plane direction. The two surfaces prefer to have a (100) face or (111) face invariably. For the purpose of obtaining the uppermost layer of the light-emitting part that has a (100) face or (111) face as the surface thereof it suffices to use a substrate having a (100) face or (111) face as the surface thereof when the uppermost layer of the light-emitting part is formed on the substrate. When a gallium arsenide (GaAs) single crystal having a (100) face as the surface thereof is used as the substrate, for example, the uppermost layer of the light-emitting part to be formed is enabled to have a (100) face as the surface thereof.

The light-emitting part can be formed on the surface of either the substrate of a Group III-V compound semiconductor single crystal, such as gallium arsenide (GaAs), indium phosphide (InP) or gallium phosphide (GaP) or the substrate of silicon (Si). The light-emitting part prefers to be formed in the DH structure wherein the carrier apt to induce radiation recombination and the emitted light are "confined" as described above. Then, the light-emitting layer prefers to be formed in an SQW structure or an MQW structure for the sake of obtaining an emitted light possessing excellent monochromaticity. As concrete examples of the means to form the component layers of the light-emitting part, the MetalOrganic Chemical Vapor Deposition (MOCVD) means, the Molecular Beam Epitaxial (MBE) means and the Liquid Phase Epitaxial (LPE) means may be cited.

Between the substrate and the light-emitting part, a buffer layer supporting the function of alleviating the lattice mismatch between the material of the substrate and the component layers of the light-emitting part and an etch stop layer utilized for selective etching are interposed. On the component layers of the light-emitting part, a contact layer for decreasing the contact resistance of an ohmic electrode, an electric current diffusing layer for diffusing a device-operating current planarly throughout the entire light-emitting part, a current-inhibiting layer for restricting the region for passing the device-operating current and a current constricting layer may be disposed. When the contact layer, the current diffusing layer and the like are installed, they are included in the light-emitting part and the transparent substrate is bonded to the uppermost layer thereof.

When the surface of the transparent supporting layer or the uppermost layer of the light-emitting part to which the supporting layer is to be bonded has flatness of 0.3 nm or less as the root-mean-square (rms) value, particularly strong bonding can be accomplished. The flat surface of this grade can be obtained by the Chemical Mechanical Polishing (CMP) means that uses a polishing agent containing silicon carbide (SiC)-based fine powder or cerium (Ce) fine powder, for example. When the surface which has undergone the CMP is further treated with an acid solution or an alkali solution, the treatment can contribute to acquisition of a clean surface by enhancing the flatness of the surface further and as well removing the foreign matter and the defiling matter that have adhered to the surface during the course of polishing.

The transparent supporting layer or the uppermost layer of the light-emitting part is subjected to the operation of bonding in a vacuum of $1 \times 10^{-2}$ Pa or less and preferably $1 \times 10^{-3}$ Pa or less in terms of pressure. Particularly, strong bonding can be formed when flat surfaces resulting from polishing are mutually bonded. On the occasion of bonding these two surfaces, it is important to have the surfaces about to be bonded each irradiated with an atom beam or an ion beam possessing energy of 50 eV or more and consequently activated. The term "activation" as used herein refers to the creation of a surface in a clean state resulting from the removal of an impurity layer and a contamination layer including oxide film and carbon and existing on the surface being bonded. When this irradiation is effected on the surface of either of the transparent supporting layer and the component layer of the light-emitting part, the layers are both bonded strongly and infallibly. When the irradiation is effected on both these surfaces, they can be bonded more strongly.

As the radiation species that prove effective in inducing strong bonding, hydrogen (H) atom, hydrogen molecule ($H_2$) and hydrogen ion (proton: $H^+$) may be cited. When a beam containing the element that exists in the surface region about to be bonded is used for the irradiation, bonding excellent in strength can be formed. When gallium phosphide (GaP) having added zinc (Zn) is used for the transparent supporting layer, for example, the irradiation of the surface about to be bonded with an atom or ion beam containing gallium (Ga), phosphorus (P) or zinc (Zn) can form strong bonding. If the surface of the transparent supporting layer or the uppermost layer of the light-emitting part possesses high electric resistance, however, the irradiation of this surface with a beam mainly containing ions will possibly electrify the surface. Since no strong bonding can be formed when this electrification of the surface induces electric repellence, the activation of the surface by the irradiation with an ion beam prefers to be utilized for the purpose of activating a surface that excels in electric conductivity.

Further, in the surface region of the transparent supporting layer or the component layer of the light-emitting part, the activation of the surface can be stably accomplished by using the beam of an inert gas, such as helium (He), neon (Ne), argon (Ar) or krypton (Kr) which causes no prominent change in the composition of the layer. The use of the beam of argon (Ar) atom (monoatomic molecule), among other conceivable beams, proves convenient in enabling ready activation of the surface in a short time. Helium (He) has a smaller atomic weight than argon (Ar) and, therefore, is at a disadvantage in wasting time in the activation of the surface about to be bonded with the He beam. On the other hand, the use of a beam of krypton (Kr) having a larger atomic weight than argon proves inconvenient because it is not unlikely to inflict injury on the surface by shock.

On the occasion of bonding the surfaces of the transparent supporting layer and the uppermost layer of the light-emitting part in an opposed and superposed state, the mechanical pressure adapted to affect the surfaces being bonded throughout proves convenient in enabling both these surfaces to be strongly bonded. To be specific, the pressure in the range between 5 g·cm$^{-2}$ or more and 100 g·cm$^{-2}$ or less is applied perpendicularly (vertically) to the surface being bonded. This method, even when either or both of the transparent supporting layer and the uppermost layer of the light-emitting part are warped, brings the effect of eliminating the warp and allowing the layers to be bonded with uniform strength.

The transparent supporting layer and the light-emitting part are bonded in vacuum of the aforementioned preferred degree while either or both of the surfaces of the supporting layer and the uppermost layer of the light-emitting part are kept at a temperature of 100° C. or less, preferably 50° C. or less, and more preferably room temperature. If the bonding is carried out in an environment kept at a high temperature exceeding about 500° C., the excess temperature will be at a disadvantage in thermally denaturing the light-emitting layer made of $(Al_xGa_{1-x})_YIn_{1-Y}P$ ($0 \leq X \leq 1$, $0 < Y \leq 1$) and incorporated in the light-emitting part and consequently impeding stable production of a compound semiconductor LED emitting light of an expected wavelength.

This invention constructs a compound semiconductor LED of high luminance by bonding the supporting layer to the uppermost layer of the light-emitting layer, thereby enabling the supporting layer to assume a state capable of mechanically supporting the light-emitting part and subsequently removing the substrate utilized for forming the light-emitting part, thereby enhancing the efficiency of extraction of the emitted light to the exterior. Particularly when an optically impervious material inevitably absorbing the light emitted from the light-emitting layer of $(Al_xGa_{1-x})_YIn_{1-Y}P$ ($0 \leq X \leq 1$, $0 < Y \leq 1$) is utilized for the substrate, the means to remove the substrate as described above can contribute to ensuring of stable production of the LED of high luminance. When a layer made of a material apt to absorb the light emitted from the light-emitting layer, such as a buffer layer, intervenes between the substrate and the light-emitting part, the removal of this intervening layer in concert with the substrate is at an advantage in heightening the luminance of the LED. The substrate can be removed by mechanical cutting, polishing, physical dry or chemical wet etching, or any of the combinations thereof. Particularly, by the selective etching means that utilizes the difference in etching speed of the materials involved, it is made possible to attain selective removal of the substrate solely and enable the substrate to be removed with good reproducibility and uniformly as well.

In the present invention, the main light-extracting surface of the light-emitting diode falls on the transparent substrate side and a first electrode and a second electrode different in polarity from the first electrode are formed on the side opposite the transparent substrate. The first electrode and the second electrode are connected to the electrode terminals on the side opposite the transparent substrate (refer to FIG. 6). In the present invention, this arrangement of the electrodes is aimed at heightening luminance. Adoption of this arrangement results in obviating the necessity of feeding an electric current to the transparent substrate to be attached. It is consequently made possible to attach the substrate having a high transmission factor and permit acquisition of high luminance.

Figure 2:
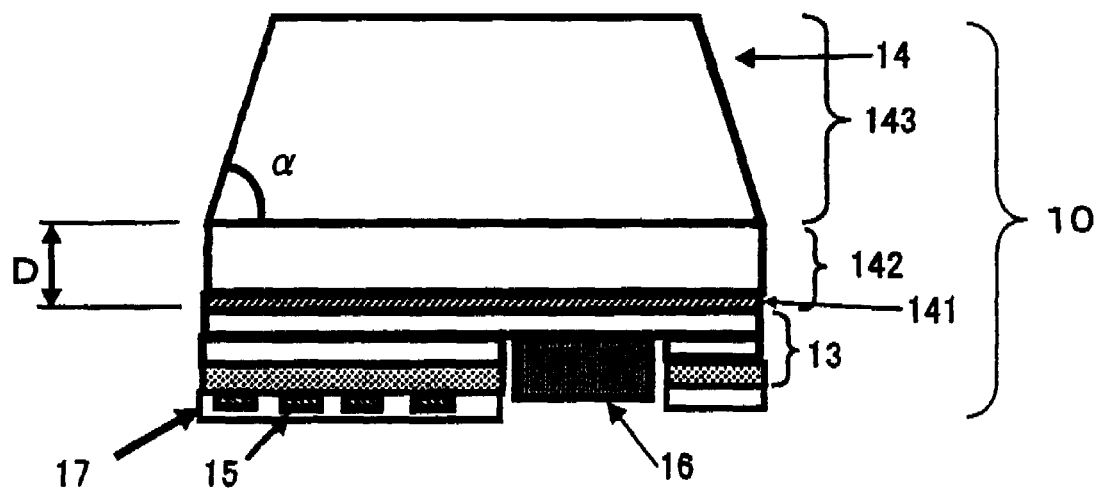
FIG. 2 is a cross section taken through FIG. 1 along line I-I.

This invention has as the side faces of the transparent substrate a first side face substantially perpendicular to the light-emitting surface of the light-emitting layer at a portion near the light-emitting layer and a second side face oblique to the light-emitting surface at a portion distant from the light-emitting layer. The obliqueness prefers to occur toward the inner side of the semiconductor layer as illustrated in FIG. 2. The reason for the present invention to use this structure resides in enabling the light emitted from the light-emitting layer toward the transparent substrate to be efficiently extracted to the exterior. That is, part of the light released from the light-emitting layer toward the transparent substrate is reflected on the first side face and enabled to be extracted through the second side face. Further, the light reflected on the second side face can be extracted through the first side face. By the synergistic effect of the first side face and the second side face, the probability of light extraction can be heightened.

Further, the present invention has the second electrode formed at the exposed corner of the semiconductor layer as illustrated in FIG. 1 and FIG. 2. The second electrode prefers to be formed at the lower position of the oblique structure constituting the second side face (the position lower than the oblique surface lest the electrode overlies the oblique surface). The present invention, by having the second electrode formed at this position, is enabled to accomplish impartation of high luminance. By adopting this structure, it is made possible to enhance the efficiency of light extraction through the oblique surface and realize impartation of high luminance.

The present invention prefers to cause the angle formed between the second side face and the plane parallel to the light-emitting surface (denoted by α in FIG. 2) to fall in the range of 55° to 80°. The choice of this range enables efficient extraction to the exterior of the light reflected in the light-emitting diode. The present invention further prefers to give the first side face a width D (in the direction of thickness) falling in the range of 30 to 100 μm. By causing the width of the first side face to fall in this range, it is made possible to allow the light reflected on the reflecting metal film to be efficiently guided through the portion of the first side face to the second side face and eventually released through the main light-extracting surface and enhance the efficiency of light emission of the light-emitting diode.

The present invention prefers to have the periphery of the second electrode so formed that it may be enclosed with the semiconductor layer. The choice of this structure brings the effect of lowering the operating voltage. By enclosing the second electrode on all sides with the first electrode, it is made possible to make the electric current flow in all directions and consequently lower the operating voltage.

This invention prefers to have the first electrode formed of a linear electrode having a width of 10 μm or less. The linear electrode may be shaped like a lattice, a mesh, a comb or the like. The choice of this structure brings about the effect of allowing impartation of high luminance. By narrowing the width of the electrode, it is made possible to add to the area of the opening of the reflecting metal film and realize imparta-tion of high luminance. The electrode may be made of any of the known materials, preferably of an Au—Ge alloy. The electrode material gives birth to a light-absorbing layer in the interface of bonding with the semiconductor layer and avoids reflecting light.

Thus, on the first electrode side surface of the light-emitting diode, a reflecting metal film is formed apart from an n-electrode. For the reflecting metal film, Au, Pt, Ti, Al and the like are available. The reflecting metal film prefers to be formed on the entire surface excepting the electrode part. Optionally, it may be formed on the electrode so as to cover the first electrode.

This invention preferably forms the light-emitting part in a structure containing a GaP layer and allows the second electrode to be formed on the GaP layer. The choice of this structure brings about the effect of lowering the operating voltage. By having the second electrode formed on the GaP layer, it is made possible to produce an ideal ohmic contact and lower the operating voltage.

This invention prefers to give the first electrode an n-type polarity and the second electrode a p-type polarity. The choice of this structure brings about the effect of enabling impartation of high luminance. The forming of the first electrode in the p-type results in deteriorating diffusion of electric current and inducing decrease of luminance. The forming of the first electrode in the n-type results in enhancing diffusion of electric current and enabling impartation of high luminance.

This invention prefers to coarsen the oblique surface of the transparent substrate. The choice of this structure brings about the effect of enhancing the efficiency of light extraction through the oblique surface. By coarsening the oblique surface, it is made possible to suppress the total reflection on the oblique surface and enhance the efficiency of light extraction. The coarsening of the surface can be accomplished, for example, by chemical etching with perhydrogenated phosphate (a mixture of phosphoric acid and hydrogen peroxide) plus hydrochloric acid.

The light-emitting diode of this invention is fabricated in accordance with the following process.

First, on the substrate of GaAs, for example, a light-emitting part containing a light-emitting layer made of $(Al_XGa_{1-X})_YIn_{1-Y}P$ ($0 \leq X \leq 1$, $0 < Y \leq 1$) is formed. Then, a compound semiconductor layer containing the light-emitting part is bonded to a transparent substrate and the substrate of GaAs is removed. This transparent substrate side is made to serve as the main light-extracting surface. On the surface opposite the main light-extracting surface remaining after the removal of the substrate, a first electrode and a second electrode different in polarity from the first electrode are formed. The first electrode is obtained by causing a metal film destined to become the electrode to adhere by vapor deposition to the surface remaining after the removal of the substrate and subsequently subjecting the deposited metal film to necessary patterning by the use of photolithographic means, thereby removing the part excepting the electrode. The second electrode is formed at the corner on the semiconductor layer exposed on the side opposite the first electrode. After the formation of the first electrode, a reflecting metal film is formed on the first surface side of the first electrode. The reflecting metal film may be enabled to cover the first electrode. Next, on the side faces of the transparent substrate, a first side face substantially perpendicular to the light-emitting surface of the light-emitting layer is formed at the portion near the light-emitting layer and a second side face oblique to the light-emitting surface is formed at the portion distant from the light-emitting layer by the dicing method. Thus, the light-emitting diode is obtained.

In this invention, the formation of the second side face by the dicing method brings about the effect of enhancing the yield of production. While the second side face can be obtained by the combination of methods, such as wet etching, dry etching, scribing and laser processing, the dicing method that exhibits high productivity proves to be the most suitable means of production.

The present invention prefers to form the first side face by the scribe and break method or the dicing method. By adopting the former method of production, it is made possible to decrease the cost of production. That is, since this method obviates the necessity of providing cutting allowance during the separation of chips, it enables fabrication of light-emitting diodes in a great quantity and reduction of the cost of production. The latter method brings about the effect of enabling impartation of high luminance. By adopting this method of production, it is made possible to enhance the efficiency of light extraction through the first side face and realize impartation of high luminance.

Now, this invention will be described specifically below by reference to Example 1, which does not limit this invention.

EXAMPLE 1

Figure 3:
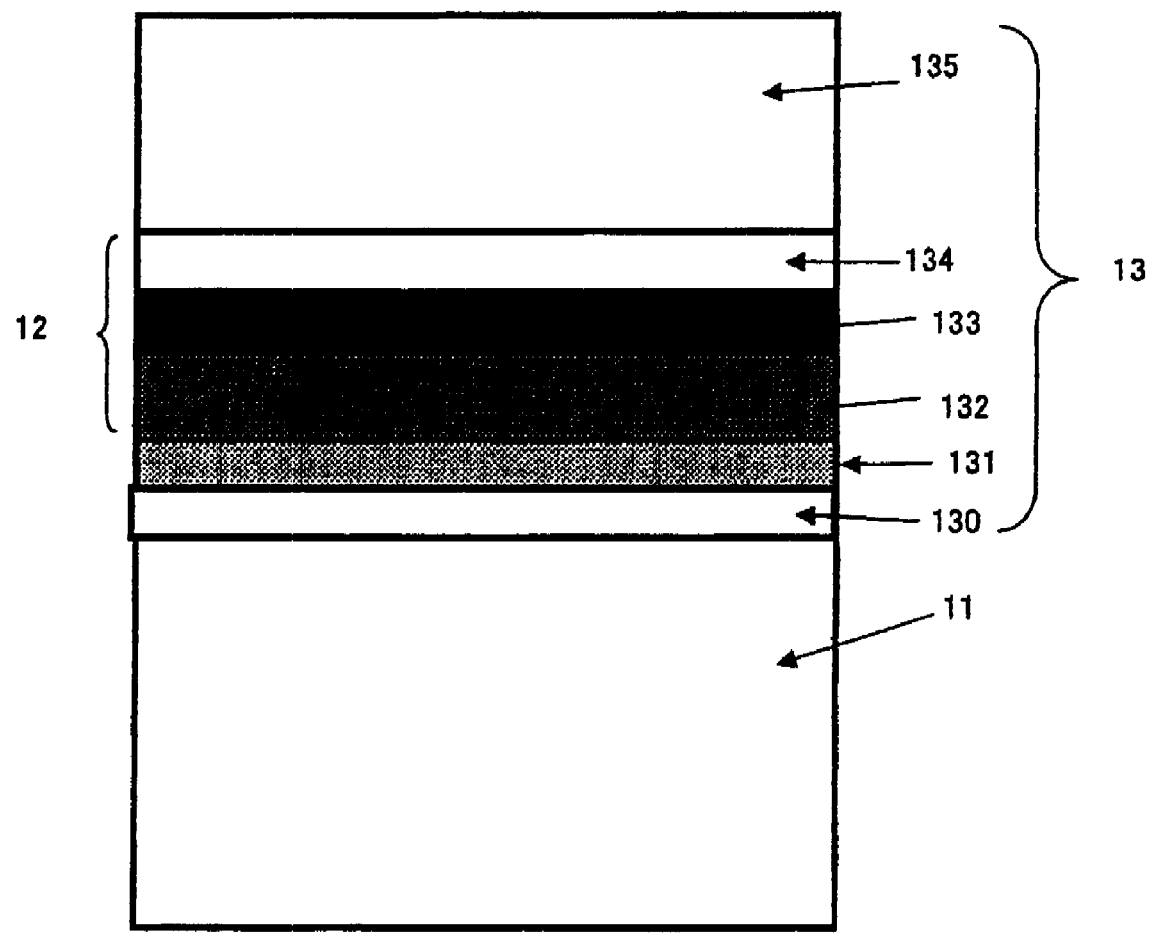
FIG. 3 is a cross section of an epitaxial wafer involved in Example 1 of this invention and Comparative Example 1.

FIG. 1 and FIG. 2 illustrate a semiconductor light-emitting diode fabricated in the present example; FIG. 1 depicting a plan view and FIG. 2 a cross section taken through FIG. 1 along line II-II. FIG. 3 is a cross section of the stacked structure of a semiconductor epitaxial wafer to be used in the semiconductor light-emitting diode.

A semiconductor light-emitting diode 10 fabricated in this example is a red color Light-Emitting Diode (LED) provided with an AlGaInP light-emitting part 12.

In this example, the present invention will be specifically described with reference to the case of fabricating a light-emitting diode by bonding an epitaxial stacked structure (epitaxial wafer) disposed on a GaAs substrate 11 to a GaP substrate 135.

The LED 10 was fabricated using an epitaxial wafer provided with semiconductor layers 13 that were staked sequentially on a semiconductor substrate 11 formed of an Si-doped n-type GaAs single crystal possessing a surface inclined by 15° from a (100) face. The stacked semiconductor layers were a buffer layer 130 of Si-doped n-type GaAs, a contact layer 131 of Si-doped n-type $(Al_{0.5}Ga_{0.5})_{0.5}In_{0.5}P$, a lower clad layer 132 of Si-doped n-type $(Al_{0.7}Ga_{0.3})_{0.5}In_{0.5}P$, a light-emitting layer 133 consisting of 20 pairs of undoped $(Al_{0.2}Ga_{0.8})_{0.5}In_{0.5}P$ and $(Al_{0.7}Ga_{0.3})_{0.5}In_{0.5}P$ an intermediate layer 134 consisting of an upper clad layer of Mg-doped p-type $(Al_{0.7}Ga_{0.3})_{0.5}In_{0.5}P$ and a thin film of $(Al_{0.5}Ga_{0.5})_{0.5}In_{0.5}P$, and an Mg-doped p-type GaP layer 135.

In the present example, the component semiconductor layers 130 to 135 were so stacked as to form an epitaxial wafer on the GaAs substrate 11 by the low-pressure MOCVD method using trimethyl aluminum (($CH_3)_3Al$), trimethyl gallium (($CH_3)_3Ga$) and trimethyl indium (($CH_3)_3In$) as raw materials for Group III component elements. As the Mg-doping raw material, biscyclopentadienyl magnesium (bis($C_5H_5)_2Mg$) was used. As the Si-doping raw material, disilane ($Si_2H_6$) was used. As the raw material for the Group V component element, phosphine ($PH_3$) or arsine ($AsH_3$) was used. The GaP layer 135 was grown at 750° C. and the other component semiconductor layers 130 to 134 composing the semiconductor layer 13 were grown at 730° C.

The GaAs buffer layer 130 had a carrier concentration of about $2\times10^{18}$ $cm^{-3}$ and a layer thickness of about 0.2 μm. The contact layer 131 formed of $(Al_{0.5}Ga_{0.5})_{0.5}In_{0.5}P$ had a carrier concentration of about $2\times10^{18}$ $cm^{-3}$ and a layer thickness of about 1.5 μm. The n-clad layer 132 had a carrier concentration of about $8\times10^{17}$ $cm^{-3}$ and a layer thickness of about 1 μm. The undoped light-emitting layer 133 had a layer thickness of 0.8 μm. The p-clad layer 134 had a carrier concentration of about $2\times10^{17}$ $cm^{-3}$ and a layer thickness of 1 μm. The Gap layer 135 had a carrier concentration of about $3\times10^{18}$ $cm^{-3}$ and a layer thickness of 9 μm.

The p-type GaP layer 135 had the region thereof reaching a depth of about 1 μm from the surface polished till mirror finish. By the mirror polishing, the surface of the p-type GaP layer 135 was made to reach a roughness of 0.18 nm. On the other hand, an n-type GaP substrate 14 to be applied to the mirror-polished surface of the p-type GaP layer 135 was prepared. To the GaP substrate 14 intended for the application, Si and Te were so added as to give the substrate a carrier concentration of about $2\times10^{17}$ $cm^{-3}$. A single crystal possessing a surface orientation of (111) was used. The GaP substrate 14 prepared for the application had a diameter of 50 mm and a thickness of 250 μm. The GaP substrate 14 had the surface thereof subjected to mirror polishing and finished till a root-mean-square (rms) value of 0.12 nm prior to being bonded to the p-type GaP layer 135.

The GaP substrate 14 and the epitaxial wafer were carried into an ordinary semiconductor material application device and the interior of the device was then evacuated to a degree of vacuum of $3\times10^{-5}$ Pa. Thereafter, the GaP substrate 14 mounted in the device from which the members made of carbonaceous material had been removed with the object of avoiding contamination with carbon or the like was heated in vacuum to a temperature of about 800° C. and, meantime, the surface of the GaP substrate 14 was irradiated with Ar ions accelerated to energy of 800 eV. Consequently, a bonding layer 141 of a nonstoichiometric composition was formed on the surface of the GaP substrate 14. After the formation of the bonding layer 141, the irradiation with Ar ions was stopped and the GaP substrate 14 was left cooling to room temperature.

Figure 4:
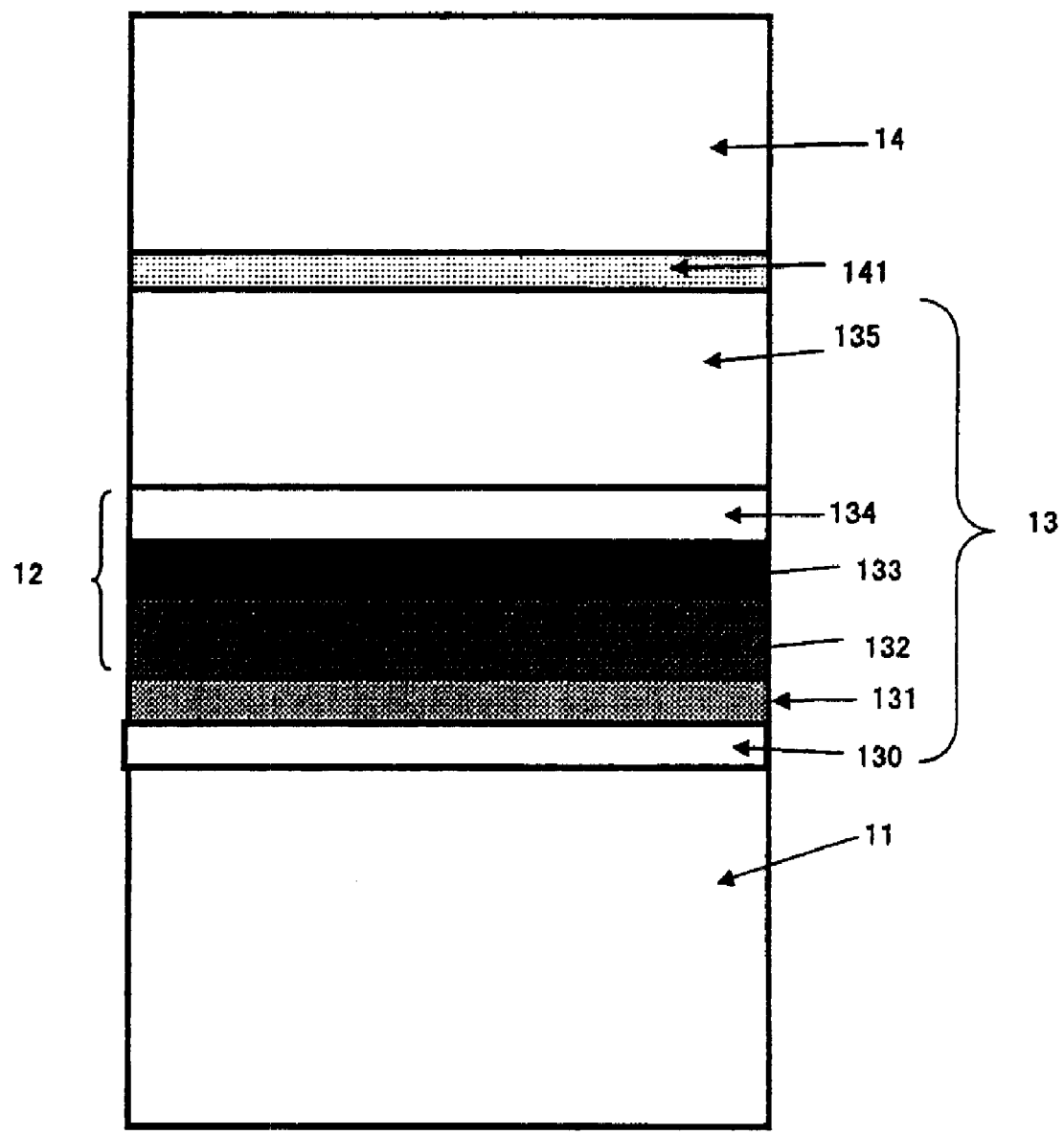
FIG. 4 is a cross section of a bonded wafer involved in Example 1 of this invention and Comparative Example 1.

Next, the surfaces of both the GaP substrate 14 provided in the surface region thereof with the bonding layer 141 of nonstoichiometric composition and the GaP layer 135 were irradiated with an Ar beam neutralized in advance by the collision of electrons over a period of 3 minutes. Thereafter, in an application device maintained in vacuum, the surfaces of both the layers 135 and 14 were superposed, exposed to such a load as to exert pressure of 20 g/$cm^2$ on each of the surfaces and bonded mutually at room temperature (refer to FIG. 4). The wafer resulting from the bonding was taken out of a vacuum chamber of the application device and the interface of bonding was analyzed. As a result, the presence of the bonding layer 141 of a nonstoichiometric composition of $Ga_{0.6}P_{0.4}$ was detected in the bonded part. The bonding layer 141 had a thickness of about 3 nm. By the ordinary method of SIMS analysis, the bonding layer 141 was found to have an oxygen atom concentration of $7\times10^{18}$ $cm^{-3}$ and a carbon atom concentration of $9\times10^{18}$ $cm^{-3}$.

Next, from the wafer produced by the bonding, the GaAs substrate 11 and the GaAs buffer layer 130 were selectively removed with an ammonia-based etchant.

On the surface of the contact layer 131, a film of a Au—Ge—Ni alloy (composed of 87 mass % of Au, 12 mass % of Ge and 1 mass % of Ni) was formed in a thickness of 0.5 μm as a first ohmic electrode 15 by the vacuum deposition method. By using the ordinary photolithographic means, the ohmic electrode 15 was formed by patterning an electrode on this film as illustrated in FIG. 1 and removing the part of the film excepting the electrode pattern. Subsequently, a reflecting metal film 17 was formed by depositing Pt in a thickness of 0.2 μm and Au in a thickness of 1 μm by the vacuum deposition method in such a manner as to cover the electrode and the region remaining after the removal of the film.

Next, the epitaxial layers 131 to 134 were selectively removed and the GaP layer 135 was exposed in the region allocated to the formation of a p-electrode. On the surface of the GaP layer, a p-type ohmic electrode 16 was formed by depositing AuBe in a thickness of 0.2 μm, Au in a thickness of 1 μm, Pt in a thickness of 0.2 μm and Au in a thickness of 2.0 μm by the vacuum deposition method.

The p-type and the n-type ohmic electrodes of low resistance were produced by a heat treatment performed at 450° C. for 10 minutes and aimed at inducing necessary alloying (refer to FIG. 1 and FIG. 2).

Next, V-shaped grooves were inserted from the surface of the GaP substrate 14 with a dicing saw so as to form a second side face 143 having an oblique angle α of 70° and a first side face 142 having a width D of 80 μm.

While the surface of the light-emitting diode was kept protected with resist, the oblique surfaces were coarsened by the use of an etchant composed of perhydrogenated phosphate and hydrochloric acid. The concaves and the convexes forming the coarsened surface differed by about 500 nm in level.

Next, the wafer was divided into chips by inserting cuts at intervals of 350 μm into the wafer from the back surface side by the use of a dicing saw. The broken layers and the contaminants produced by the dicing were removed by etching with a mixed liquid of sulfuric acid and hydrogen peroxide to complete fabrication of the semiconductor light-emitting diode (chip) 10.

Figure 5:
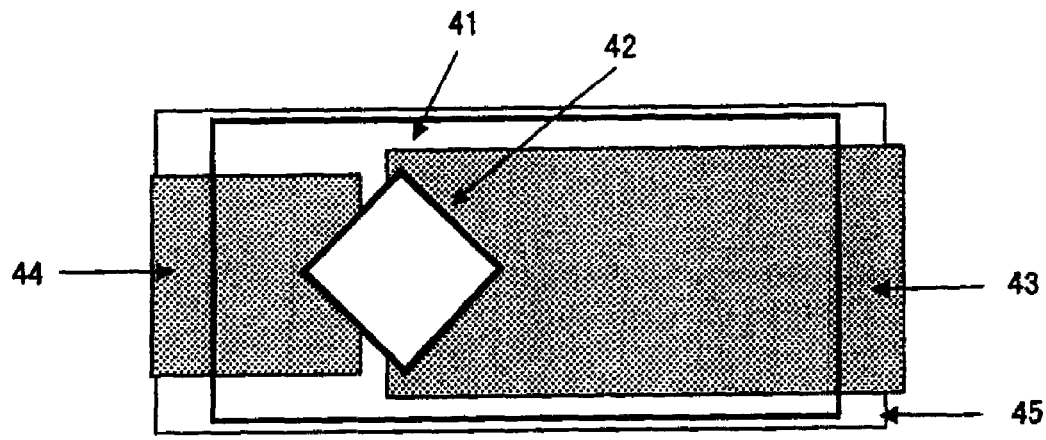
FIG. 5 is a plan view of a light-emitting diode involved in Example 1 of this invention and Comparative Example 1.
Figure 6:
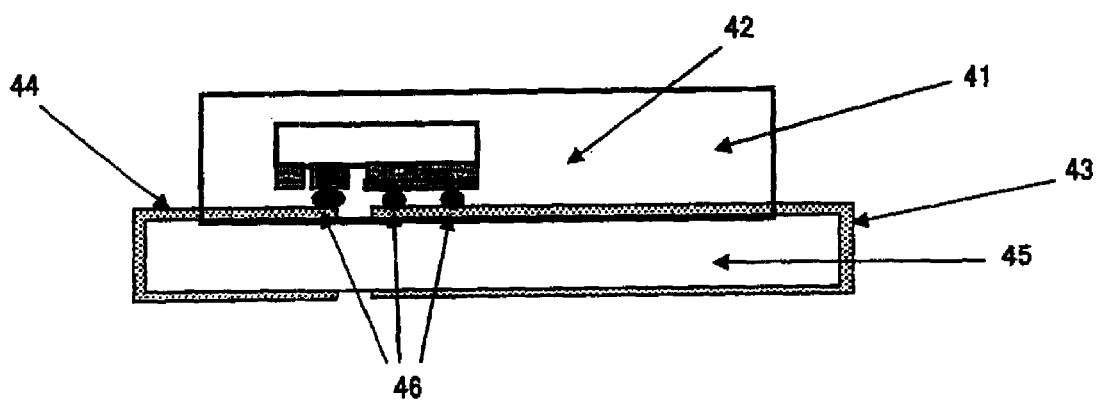
FIG. 6 is a cross section of a light-emitting diode involved in Example 1 of this invention and Comparative Example 1.

A light-emitting diode lamp 42 was assembled as illustrated schematically in FIG. 5 and FIG. 6 with the LED chips 10 fabricated as described above. This LED lamp 42 was manufactured by fixing the LED chip 10 fast to a mounting substrate 45 through bonding with gold bumps 46 between the n-type ohmic electrode 15 of the LED chip 10 and an n-electrode terminal 43 disposed on the first surface of a mounting substrate 45 and between the p-type ohmic electrode 16 and a p-electrode terminal 44 as well and subsequently sealing the consequently formed joints with an ordinary epoxy resin 41.

When an electric current was passed between the n-type and p-type ohmic electrodes 15 and 16 via the n-electrode terminal 43 and the p-electrode terminal disposed on the first surface of the mounting substrate 45, the lamp 42 emitted a red color light having a main wavelength of 620 nm. The forward voltage (Vf) generated during the passage of an electric current of 20 mA in the forward direction reached about 1.96 V. This showed the fact that reflected the proper disposition of the electrodes and the good ohmic property exhibited by each of the ohmic electrodes 15 and 16. The intensity of the light emitted when the forward electric current was set at 20 mA was found to induce high luminance of 650 mcd. This showed the fact that reflected the configuration of the light-emitting part of high efficiency of light emission and the enhancement of the efficiency of extraction of light to the exterior due to the removal of the broken layers occurring during the cutting of the wafer into chips.

EXAMPLE 2

Figure 7:
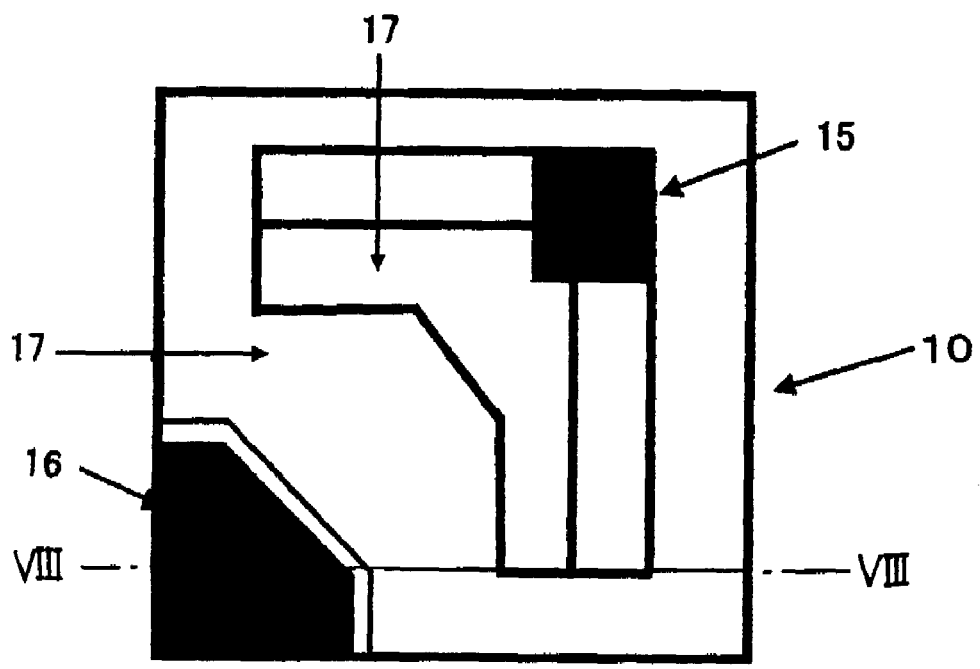
FIG. 7 is a plan view of a semiconductor light-emitting diode involved in the second embodiment of this invention.
Figure 8:
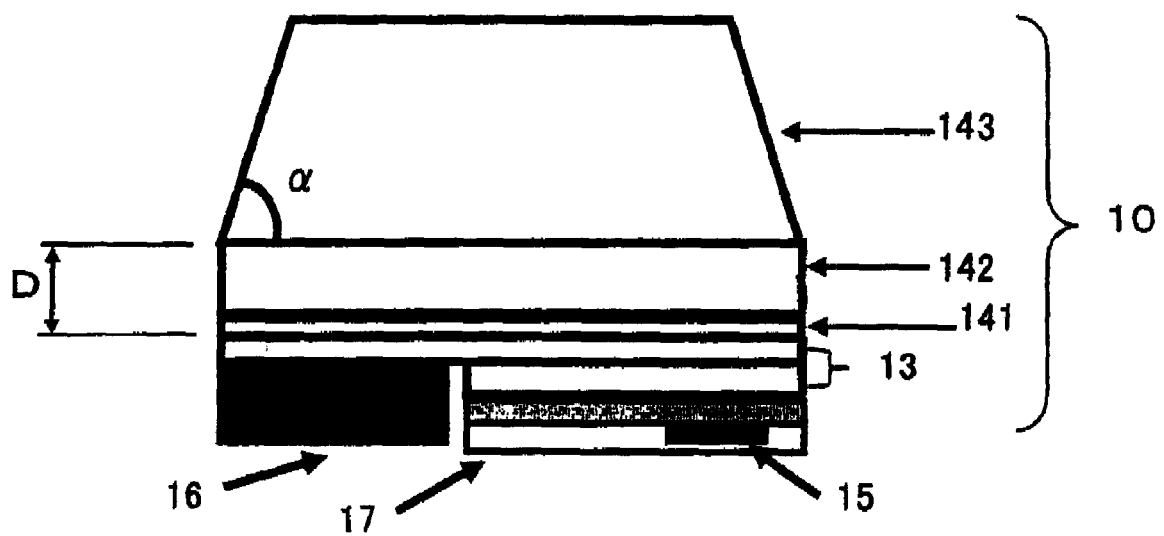
FIG. 8 is a cross section taken through FIG. 7 along line VIII-VIII.

FIG. 7 is a plan view depicting the second embodiment of the light-emitting diode contemplated by this invention and FIG. 8 is a cross section taken through FIG. 7 along line VIII-VIII.

The light-emitting diode shown in FIG. 7 and FIG. 8 was fabricated under the same conditions as in Example 1.

When an electric current was passed between the n-type and p-type ohmic electrodes 15 and 16 via the n-electrode terminal and the p-electrode terminal disposed on the first surface of the mounting substrate, the lamp emitted a red color light having a main wavelength of 620 nm. The forward voltage (Vf) generated during the passage of an electric current of 20 mA in the forward direction reached about 2.10 V. This showed the fact that reflected the proper disposition of the electrodes and the good ohmic property exhibited by each of the ohmic electrodes 15 and 16. The intensity of the light emitted when the forward electric current was set at 20 mA was found to induce high luminance of 850 mcd. This showed the fact that reflected the configuration of the light-emitting part of high efficiency of light emission and the enhancement of the efficiency of extraction of light to the exterior due to the removal of the broken layers occurring during the cutting of the wafer into chips.

COMPARATIVE EXAMPLE 1

Figure 9:
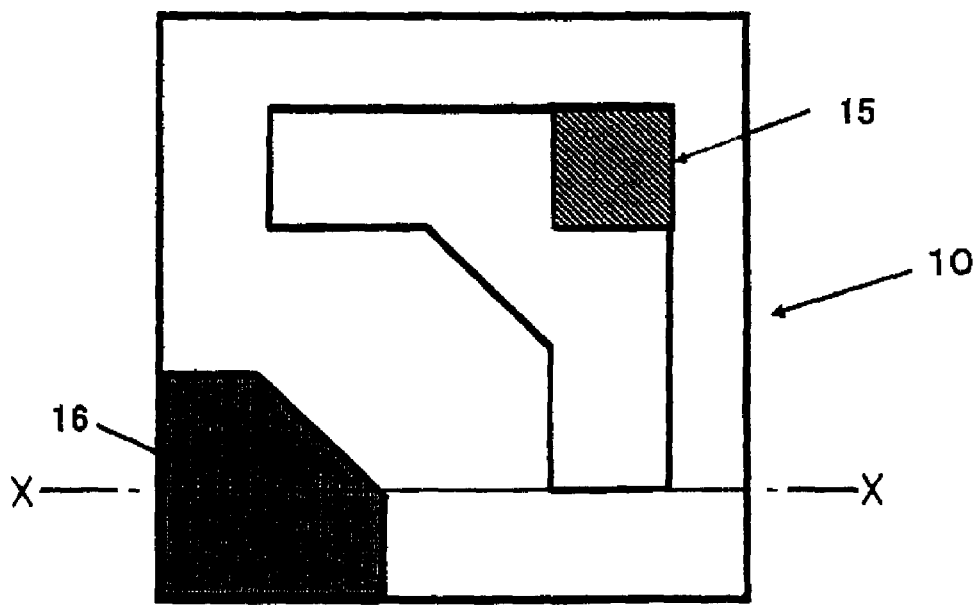
FIG. 9 is a plan view of a semiconductor light-emitting diode involved in Comparative Example 1.
Figure 10:
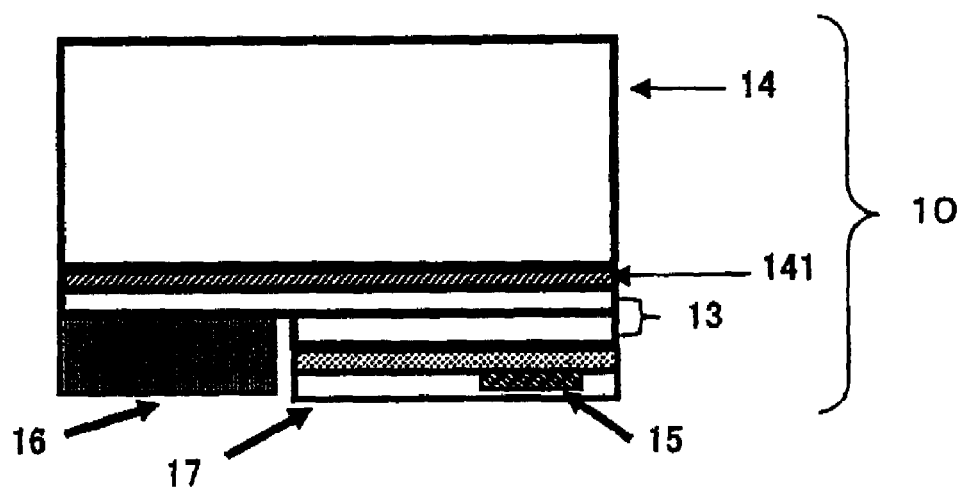
FIG. 10 is a cross section taken through FIG. 9 along line X-X.

A p-type and an n-type ohmic electrodes were formed as illustrated in FIG. 9 and FIG. 10 by bonding a transparent substrate 14 to semiconductor layers 13 similarly to Example 1 excepting the side faces of the transparent substrate were formed perpendicularly to a light-emitting layer.

Next, the wafer was divided into chips by inserting cuts at intervals of 350 μm into the wafer from the back surface side by the use of a dicing saw. The broken layers and the contaminants produced by the dicing were removed by etching with a mixed liquid of sulfuric acid and hydrogen peroxide to complete fabrication of the semiconductor light-emitting diode (chip) 10.

A light-emitting diode lamp 42 was assembled as illustrated schematically in FIG. 5 and FIG. 6 with the LED chips 10 fabricated as described above. This LED lamp 42 was manufactured by fixing the LED chip 10 fast to a mounting substrate 45 through bonding with gold bumps 46 between the n-type ohmic electrode 15 of the LED chip 10 and an n-electrode terminal 43 disposed on the first surface of the mounting substrate 45 and between the p-type ohmic electrode 16 and a p-electrode terminal 44 as well and subsequently sealing the consequently formed joints with an ordinary epoxy resin 41.

When an electric current was passed between the n-type and p-type ohmic electrodes 15 and 16 via the n-electrode terminal 43 and the p-electrode terminal 44 disposed on the first surface of the mounting substrate 45, the lamp 42 emitted a red color light having a main wavelength of 620 nm. The forward voltage (Vf) generated during the passage of an electric current of 20 mA in the forward direction reached about 2.30 V. The intensity of emitted light during the passage of a forward electric current of 20 mA was 250 mcd.

Industrial Applicability

The light-emitting diode of this invention is capable of emitting a light of red color, orange color, yellow color or even yellowish green color and exhibiting high luminance. Thus, it can be utilized as various display lamps.

The invention claimed is:

1. A light-emitting diode having a light-extracting surface and comprising a transparent substrate, a compound semiconductor layer bonded to the transparent substrate, a light-emitting part contained in the compound semiconductor layer, a light-emitting layer contained in the light-emitting part and formed of $(Al_XGa_{1-X})_YIn_{1-Y}P$ ($0 \leq X \leq 1$, $0 < Y \leq 1$), a first electrode and a second electrode of different polarities provided on a surface of the light-emitting diode opposite the light-extracting surface, and a reflecting metal film containing any of Au, Pt, Ti and Al formed on the first electrode, wherein the transparent substrate has a first side face virtually perpendicular to a light-emitting surface of the light-emitting layer on a side near the light-emitting layer and a second side face oblique to the light-emitting surface on a side distant from the light-emitting layer and wherein the first and second electrodes are mounted respectively on electrode terminals.

2. A light-emitting diode according to claim 1, wherein the second electrode is formed at a position of a corner of the compound semiconductor layer on a side opposed to the first electrode.

3. A light-emitting diode according to claim 2, wherein the second electrode is positioned below an oblique structure of the second side face.

4. A light-emitting diode according to claim 1, wherein the transparent substrate is made of an n-type GaP.

5. A light-emitting diode according to claim 1, wherein the transparent substrate has a (100) or (111) surface orientation.

6. A light-emitting diode according to claim 1, wherein the transparent substrate has a thickness in a range of 50 to 300 μm.

7. A light-emitting diode according to claim 1, wherein the light-emitting part has an outermost layer having a thickness in a range of 0.5 to 20 μm.

8. A light-emitting diode according to claim 1, wherein the light-emitting part has an outermost layer made of GaP.

9. A light-emitting diode according to claim 8, wherein the light-emitting part has an outermost layer made of $Ga_XP_{1-X}$ ($0.5 < X < 0.7$).

10. A light-emitting diode according to claim 1, wherein the second side face and a surface parallel to the light-emitting surface form an angle in a range of 55° to 80°.

11. A light-emitting diode according to claim 1, wherein the first side face has a width in a range of 30 to 100 μm.

12. A light-emitting diode according to claim 1, wherein the second electrode has a periphery thereof enclosed with the semiconductor layer.

13. A light-emitting diode according to claim 1, wherein the first electrode is in a lattice shape.

14. A light-emitting diode according to claim 1, wherein the first electrode is a linear electrode having a width of 10 μm or less.

15. A light-emitting diode according to claim 1, wherein the light-emitting part contains a GaP layer and the second electrode is formed on the GaP layer.

16. A light-emitting diode according to claim 1, wherein the first electrode has an n type polarity and the second electrode has a p type polarity.

17. A light-emitting diode according to claim 1, wherein the second side face of the transparent substrate has a coarsened surface.

18. A method for the production of a light-emitting diode as claimed in claim 1, comprising the steps of forming the light-emitting part containing a light-emitting layer formed of $(Al_XGa_{1-X})_YIn_{1-Y}P$ ($0 \leqq X \leqq 1$, $0 < Y \leqq 1$), bonding the compound semiconductor layer containing the light-emitting part to the transparent substrate, forming the first electrode and the second electrode different in polarity from the first electrode on a surface of the compound semiconductor opposite a main light-extracting surface, which surface is on a side opposite the transparent substrate, wherein the second electrode is formed on the compound semiconductor layer exposed on a side opposed to the first electrode, forming a reflecting metal film containing any of Au, Pt, Ti and Al on a surface of the first electrode, and forming on side faces of the transparent substrate the first side face virtually perpendicular to the light-emitting surface of the light-emitting layer on a side near the light-emitting layer and the second side face oblique to the light-emitting surface on a side distant from the light-emitting layer by the dicing method.

19. A method for the production of a light-emitting diode according to claim 18, wherein the second electrode is formed in a corner on the compound semiconductor layer exposed on a side opposed to the first electrode.

20. A method for the production of a light-emitting diode according to claim 18, wherein the first side face is formed by the scribe and break method.

21. A method for the production of a light-emitting diode claim 18, wherein the first side face is formed by the dicing method.

22. A light-emitting diode having the light-emitting diode according to claim 1 mounted thereon face-down.

* * * * *